（12) United States Patent
Ishida et al.

(10) Patent No.: US 7,136,276 B2
(45) Date of Patent: Nov. 14, 2006

(54) SOLID ELECTROLYTIC CAPACITOR AND MOUNTING METHOD THEREFOR

(75) Inventors: Hideki Ishida, Hyogo (JP); Eizo Fujii, Osaka (JP); Yasuhiro Kishimoto, Tokyo (JP); Hitoshi Ibuta, Osaka (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 11/296,388

(22) Filed: Dec. 8, 2005

(65) Prior Publication Data
US 2006/0082953 A1    Apr. 20, 2006

Related U.S. Application Data

(63) Continuation of application No. 10/533,524, filed as application No. PCT/JP04/05179 on Apr. 9, 2004.

(30) Foreign Application Priority Data
Apr. 9, 2003    (JP)    .............................. 2003-105589

(51) Int. Cl.
*H01G 4/228* (2006.01)
*H01G 9/00* (2006.01)
(52) U.S. Cl. ...................... 361/540; 361/538
(58) Field of Classification Search ........ 361/528–529, 361/532–541
See application file for complete search history.

(56) References Cited
U.S. PATENT DOCUMENTS
3,588,628 A * 6/1971 Peck ........................... 361/540

5,478,965 A *  12/1995  Hashiba ........................ 29/25.03
6,870,727 B1     3/2005  Edson et al. .................. 361/523
6,903,921 B1     6/2005  Ishijima ........................ 361/523
2002/0163775 A1* 11/2002  Maeda ........................... 361/528
2003/0151884 A1  8/2003  Matsumoto .................... 361/523
2004/0160730 A1* 8/2004  Tsutsui et al. ................ 361/528

FOREIGN PATENT DOCUMENTS

| JP | 02105511 A | * | 4/1990 |
|---|---|---|---|
| JP | 10-64761 | | 3/1998 |
| JP | 2001-68841 | | 3/2001 |
| JP | 2001-244145 | | 9/2001 |
| JP | 2001-358041 | | 12/2001 |

* cited by examiner

Primary Examiner—Eric W. Thomas
(74) Attorney, Agent, or Firm—Armstrong, Kratz, Quintos, Hanson & Brooks, LLP

(57) ABSTRACT

A solid electrolytic capacitor which includes a capacitor element in which a dielectric coating layer and a cathode layer are sequentially formed on a surface of an anode element having an anode lead member planted on one end surface thereof, an anode terminal connected with the anode lead member, a platy cathode terminal mounting the capacitor element thereon and connected with the cathode layer, and an enclosure resin coating the capacitor element, a part of the cathode terminal and a part of the anode terminal being exposed on a same plane from the enclosure resin. The cathode terminal is provided with a cathode exposed portion exposed from the enclosure resin in at least two locations on the same plane.

39 Claims, 6 Drawing Sheets

FIG. 1
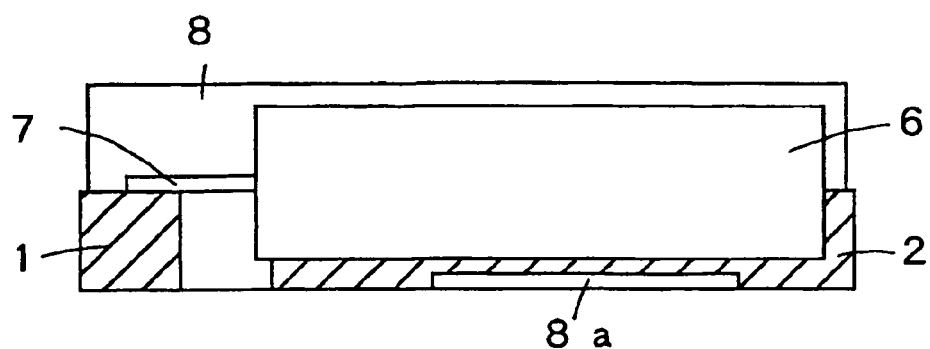
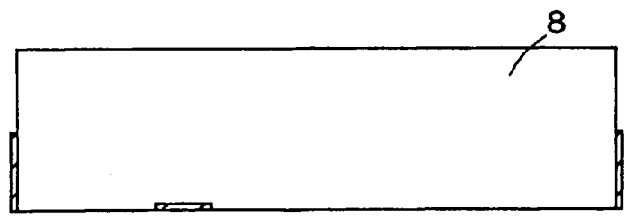
FIG. 2 (a)
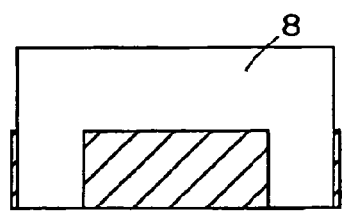
FIG. 2 (c)
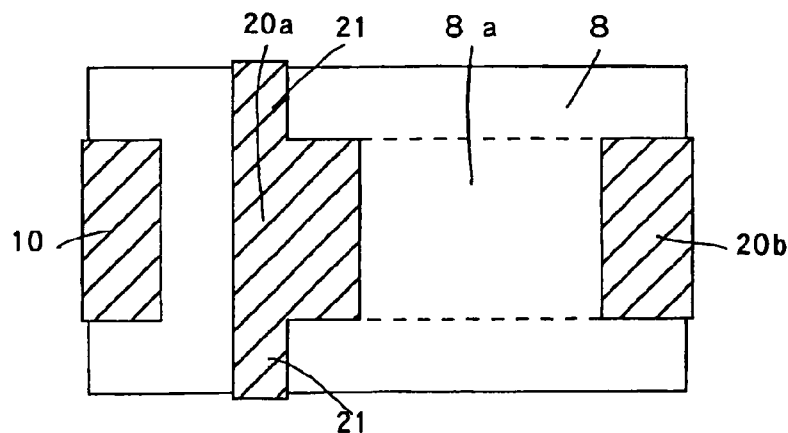
FIG. 2 (b)

FIG. 3
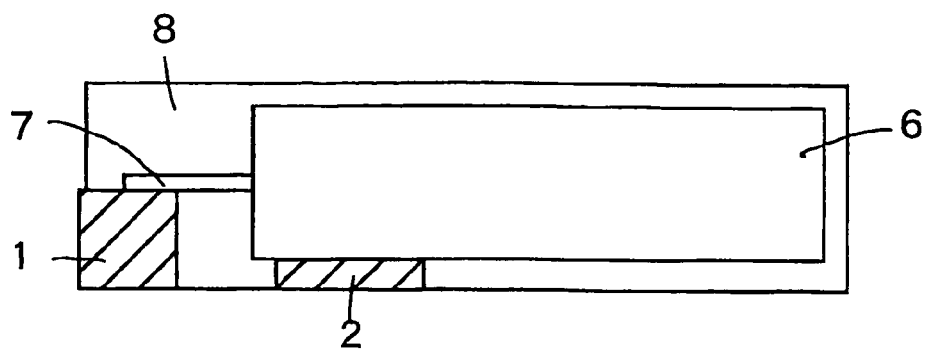
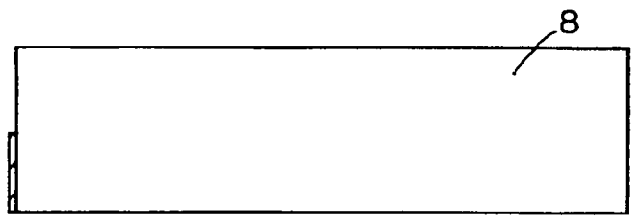
FIG. 4 (a)
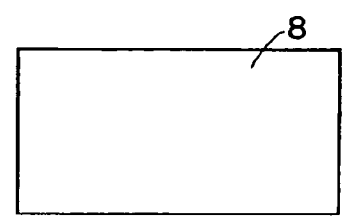
FIG. 4 (c)
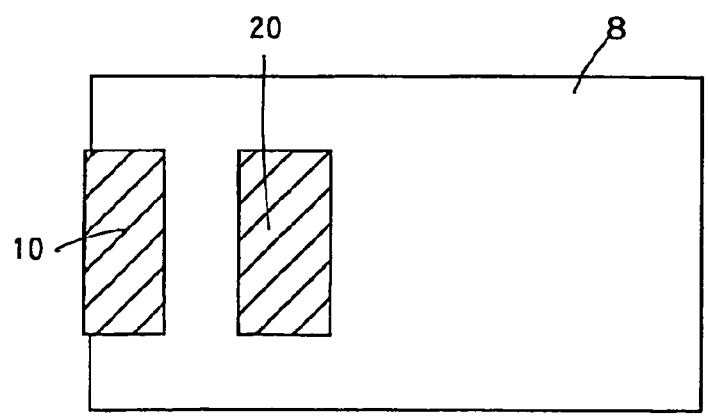
FIG. 4 (b)

SOLID ELECTROLYTIC CAPACITOR AND MOUNTING METHOD THEREFOR

CROSS REFERENCE TO RELATED APPLICATION

This application is a continuation of Ser. No. 10/533,524, filed May 2, 2005, which is a 35 U.S.C. 371 application of international application No. PCT/JP04/05179 filed Apr. 9, 2004, which is based on Japanese Application No. 2003-105589 filed Apr. 9, 2003.

TECHNICAL FIELD

The present invention relates to a solid electrolytic capacitor and mounting method therefor.

BACKGROUND ART

Conventionally, a solid electrolytic capacitor of a structure shown in FIG. 6 is known. This solid electrolytic capacitor includes a capacitor element 6 including an anode element 3 including a sintered body of a valve-action metal (tantalum, niobium, titanium, aluminum, etc.), a dielectric coating layer 4 formed on a surface of the anode element 3 by oxidizing the surface, and a cathode layer 5 in which a solid electrolyte layer 5a made of a conductive inorganic material such as manganese dioxide or conductive organic material such as TCNQ complex salt and a conductive polymer and a cathode lead layer 5b made of carbon, silver, etc. are sequentially formed. An anode lead frame 11 is connected to an anode lead member 7 planted on one end surface of the anode element 3 while a cathode lead frame 12 is connected to the cathode layer 5. An enclosure resin 8 made of epoxy resin etc. coats the capacitor element 6 to seal the capacitor. The anode lead frame 11 and the cathode lead frame 12 are bent along the enclosure resin 8 (see JP 10-64761 A).

In the solid electrolytic capacitor of the above-described structure, because both an upper face and a lower face of the capacitor element need be coated with the enclosure resin, there is a problem that a size of the capacitor element cannot be sufficiently large relative to an overall size as a solid electrolytic capacitor finished product.

Accordingly, as shown in FIG. 7, the present applicant has proposed a technique in which a capacitor element 6 is mounted on a platy anode terminal 1 and a cathode terminal 2 to make a gap between the capacitor element 6 and an outer periphery of an enclosure resin 8 as small as possible, so that the capacitor element 6 with a large occupied volume relative to an overall size of a solid electrolytic capacitor finished product can be incorporated (JP 2001-244145 A).

In this solid electrolytic capacitor, because the lead terminal is in direct contact with a circuit board etc., a lead frame need not be bent along the enclosure resin as conventionally, so that a current path from the capacitor element to the circuit board can be shortened to reduce an ESR and ESL in the solid electrolytic capacitor finished product.

Furthermore, as shown in FIG. 8, a distance between current paths of each of an anode and a cathode to an external circuit board can be shortened by extending the cathode terminal 2 of the solid electrolytic capacitor to a vicinity of the anode terminal 1, so that an ESL in a high-frequency area can be further reduced.

When the above-described solid electrolytic capacitor proposed by the present applicant is connected to a circuit board etc., as shown in FIG. 9(a), a solder 50 is pasted on a land 40 formed on the circuit board 30, and then the solid electrolytic capacitor is mounted thereon.

However, in the solid electrolytic capacitor, a difference in area between an anode exposed portion of the anode terminal 1 exposed from the enclosure resin 8 and a cathode exposed portion of the cathode terminal 2 exposed from the enclosure resin 8 is greater than that in the conventional capacitor. Therefore, there is a problem that as shown in FIG. 9(b), the solder 50 pasted on the land 40 with a larger area corresponding to the cathode exposed portion shrinks by surface tension and pushes up the solid electrolytic capacitor mounted on the solder 50 to cause displacement, resulting in a defective appearance and disconnection in the anode terminal.

The present invention provides, in view of the above-described problem, a solid electrolytic capacitor capable of being soldered well to a circuit board etc. while maintaining an ESL reduction effect previously proposed by the present applicant.

DISCLOSURE OF THE INVENTION

The present invention provides a solid electrolytic capacitor comprising a capacitor element in which a dielectric coating layer and a cathode layer are sequentially formed on a surface of an anode element having an anode lead member planted on one end surface thereof, an anode terminal connected with the anode lead member, a platy cathode terminal mounting the capacitor element thereon and connected with the cathode layer, and an enclosure resin coating the capacitor element, a part of the cathode terminal and a part of the anode terminal being exposed on a same plane from the enclosure resin, wherein the cathode terminal is provided with a cathode exposed portion exposed from the enclosure resin in at least two locations on the same plane.

The present invention further provides a mounting method for a solid electrolytic capacitor for fixing the above-described solid electrolytic capacitor to a circuit board through a solder, wherein the circuit board has lands each provided in a position corresponding to each of the anode exposed portion and the cathode exposed portion, and the solder is pasted on each of the lands to solder the solid electrolytic capacitor to the circuit board.

Using the above-described method, in a process of mounting the solid electrolytic capacitor on the pasted solder, a difference in area between the anode exposed portion and the cathode exposed portion can be smaller, and an area ratio of each of the lands corresponding to the exposed portions (a difference between solder paste quantities) can be also smaller. Therefore, displacement of the solid electrolytic capacitor can be suppressed, and a problem of a defective appearance etc. can be solved with excellent solder paste.

BRIEF DESCRIPTION OF THE DRAWINGS

FIG. 1 is a longitudinal sectional view of a solid electrolytic capacitor of an embodiment of the present invention;

FIG. 2 includes a longitudinal side view (a), bottom view (b) and transverse side view (c) of the solid electrolytic capacitor of the embodiment of the present invention;

FIG. 3 is a longitudinal sectional view of a solid electrolytic capacitor of a comparative example;

FIG. 4 includes a longitudinal side view (a), bottom view (b) and transverse side view (c) of the solid electrolytic capacitor of the comparative example;

BEST MODE FOR CARRYING OUT THE INVENTION

Figure 5:
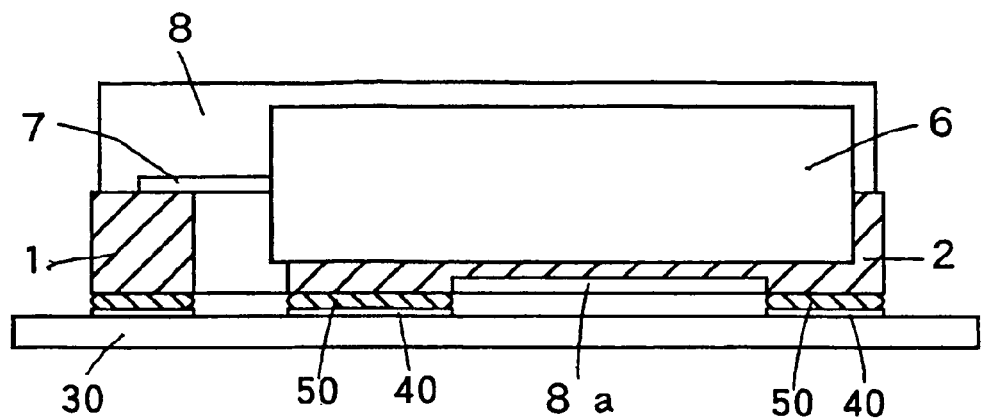
FIG. 5 shows a process of connecting the solid electrolytic capacitor of the embodiment to a circuit board.
Figure 6:
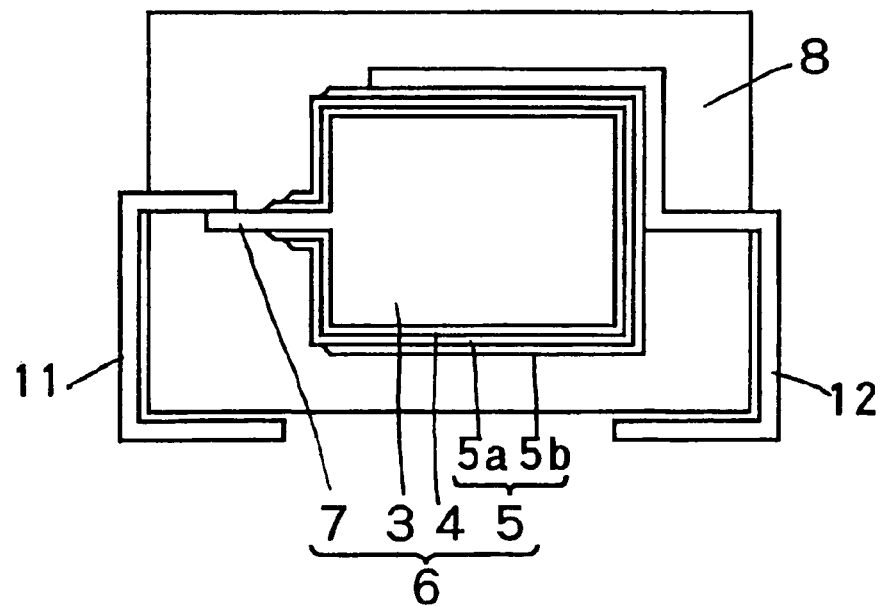
FIG. 6 is a longitudinal sectional view of a conventional solid electrolytic capacitor.
Figure 7:
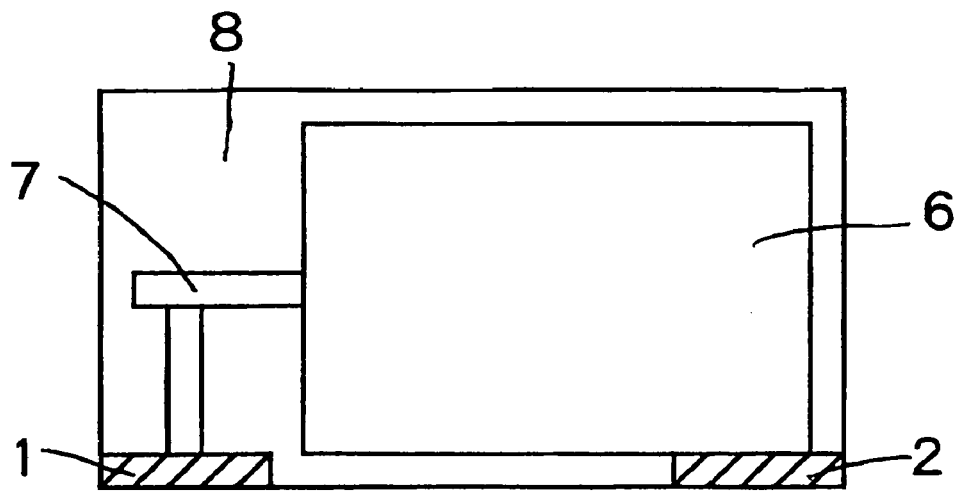
FIG. 7 is a longitudinal sectional view of another conventional solid electrolytic capacitor.
Figure 8:
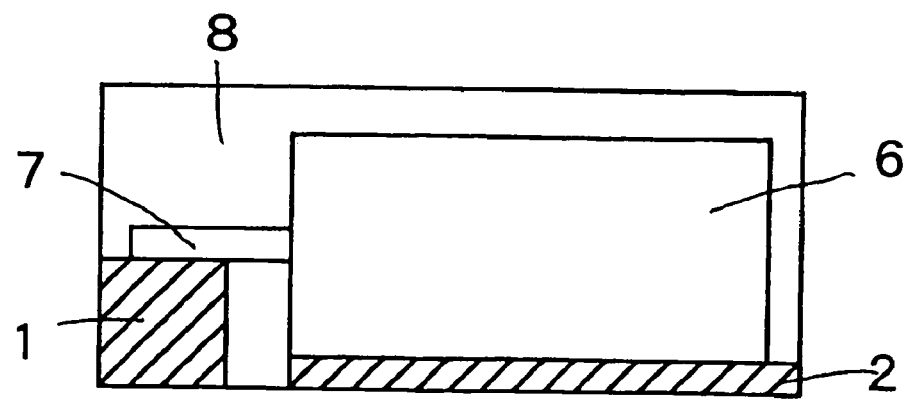
FIG. 8 is a longitudinal sectional view of a solid electrolytic capacitor previously devised by the present applicant.
Figure 9:
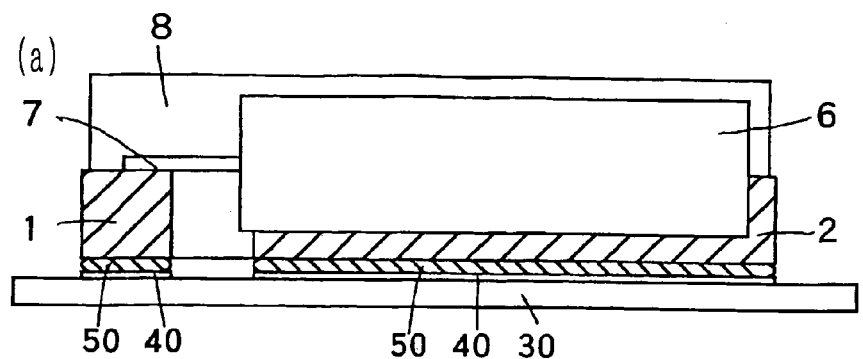
FIG. 9 shows processes of connecting to a circuit board the solid electrolytic capacitor previously devised by the present applicant.
Figure 9:
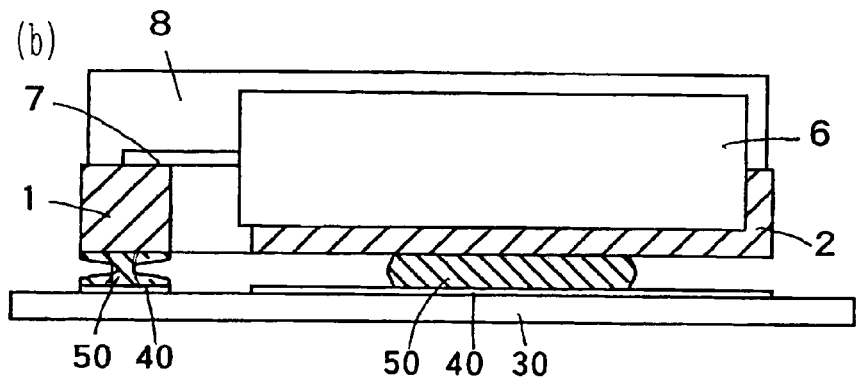

A description of one embodiment of the present invention will be given below with reference to the drawings.

Embodiment

FIG. 1 is a longitudinal sectional view of a solid electrolytic capacitor of the present invention. FIG. 2 includes a longitudinal side view (a), bottom view (b) and transverse side view (c) of the solid electrolytic capacitor of the present invention.

This solid electrolytic capacitor is fabricated by forming a dielectric oxide coating 4 on a surface of an anode element 3 including a sintered tantalum having an anode lead member 7 planted on one end surface thereof, providing a cathode layer 5 in which a solid electrolyte layer 5a made of a conductive polymer and a cathode lead layer 5b made of carbon and silver etc. are sequentially formed to fabricate a capacitor element 6, connecting an anode terminal 1 to the anode lead member 7, connecting a cathode terminal 2 to the cathode layer 5, and coating the capacitor element 6 with an enclosure resin 8 made of epoxy resin etc. to seal the capacitor. An alloy consisting mainly of copper was used as materials for the anode terminal 1 and cathode terminal 2.

The cathode terminal 2 has, on a bottom face (lower face) of the solid electrolytic capacitor, a first cathode exposed portion 20a exposed in a vicinity of an anode exposed portion 1a, where the anode terminal 1 is exposed, and a second cathode exposed portion 20b exposed from a portion opposed to the anode exposed portion 1a. Provided between the first cathode exposed portion 20a and the second cathode exposed portion 20b is a cathode buried portion 8a in which an enclosure resin enters a recessed portion provided on the cathode terminal 2 by sputtering etc. Furthermore, the anode exposed portion 10 and the second cathode exposed portion 20b extend to end portions of the solid electrolytic capacitor in a planted direction of the anode lead member (a longitudinal direction), and the first cathode exposed portion 20a has extending portions 21 extending to end portions in a direction perpendicular to the planted direction of the anode lead member (a transverse direction) with the bottom face of the solid electrolytic capacitor as a reference.

A mounting method for the solid electrolytic capacitor of the present invention is described below with reference to the drawing. FIG. 5 shows a process of soldering the solid electrolytic capacitor of the present invention to a circuit board. The circuit board 30 is provided with a land 40 in each position corresponding to the anode exposed portion 10 and the cathode exposed portion 20 of the solid electrolytic capacitor of the embodiment. A solder 50 is pasted on the land 40, and thereafter the solid electrolytic capacitor is mounted to be soldered by reflow process.

Using the above-described method, in the process of mounting the solid electrolytic capacitor on the pasted solder, a difference in area between the anode exposed portion 10 and the cathode exposed portion 20 can be smaller, and an area ratio of the land 40 corresponding to each of the exposed portions (a difference between solder paste quantities) can be also smaller. Therefore, displacement of the solid electrolytic capacitor can be suppressed, and a problem of a defective appearance etc. can be solved with excellent solder paste.

COMPARATIVE EXAMPLE

FIG. 3 is a longitudinal sectional view of a solid electrolytic capacitor of a comparative example. FIG. 4 includes a longitudinal side view (a), bottom view (b) and transverse side view (c) of the solid electrolytic capacitor of the comparative example. In this solid electrolytic capacitor, a capacitor element 6 is fabricated in the same method as in the embodiment, and a cathode exposed portion 20 is provided in only one location in a vicinity of an anode exposed portion 1a, where an anode terminal 1 is exposed.

An ESL reduction effect of Patent Application 2002-9611 previously proposed by the present applicant is the greatest when the cathode terminal 20 is formed on a lower face including an end portion of the capacitor element 6 nearest the anode terminal 1.

Therefore, the ESL reduction effect can be obtained also in the solid electrolytic capacitor of the comparative example like in the solid electrolytic capacitor of the embodiment. However, when the solid electrolytic capacitor is connected to the circuit board 30, an unbalanced position of the anode exposed portion 10 and the cathode exposed portion 20 weakens fixing strength, so that the solid electrolytic capacitor can be easily removed from the circuit board 30 due to pressure or stress from an outside.

Compared to this, because the solid electrolytic capacitor of the embodiment can be fixed at three points of the anode exposed portion 10, the first cathode exposed portion 20a, and the second cathode exposed portion 20b, fixing strength of the solid electrolytic capacitor and the circuit board is improved. Therefore, the solid electrolytic capacitor can be soldered well while maintaining the ESL reduction effect previously proposed by the present applicant.

Furthermore, because the extending portion 21 is provided, the first cathode exposed portion 20a is exposed from a side face of the solid electrolytic capacitor in the transverse direction, so that solder paste can be checked at a glance after a process therefor. The extending portion is not particularly limited in number and shape, and a number thereof may be one or more. The extending portion may be provided on only one side of the first cathode exposed portion 21 or both sides thereof if exposed from the side face.

Figure 10:
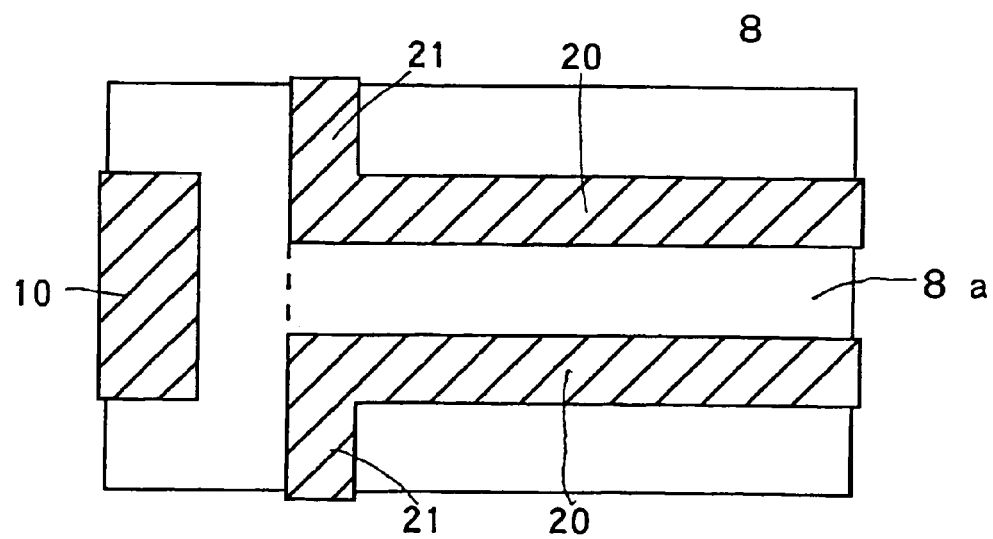
FIG. 10 is a bottom view of a solid electrolytic capacitor of another embodiment.

FIG. 10 shows another embodiment of the present invention in which on a lower face of a solid electrolytic capacitor, cathode exposed portions 20 each including an extending portion 21 are provided in two locations with a cathode buried portion 8a therebetween, so that an ESL reduction effect and improved connecting strength can be obtained while a check after solder paste can be done.

Figure 11:
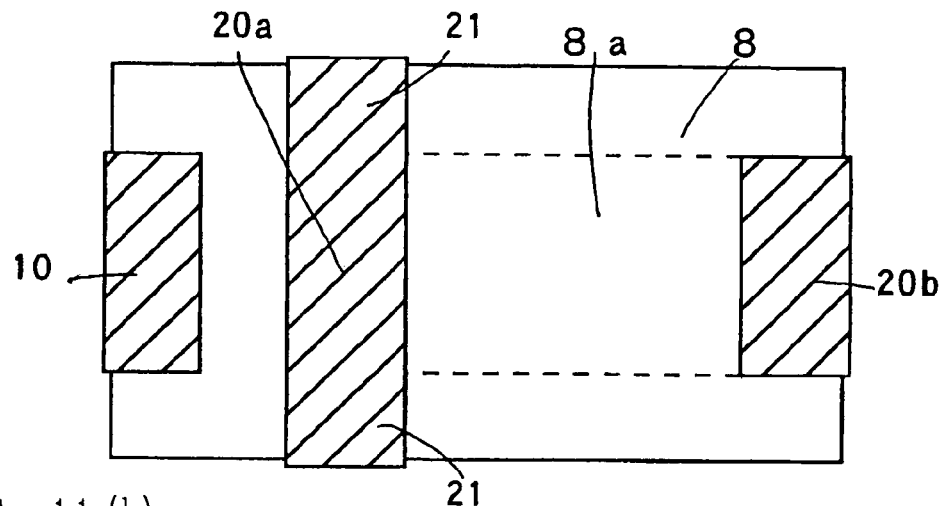
FIG. 11 includes bottom views of solid electrolytic capacitors of other embodiments.
Figure 11:
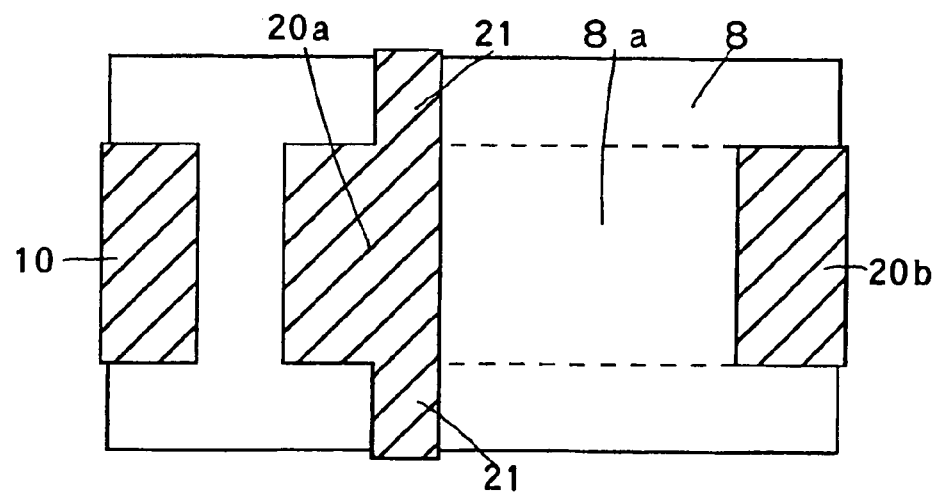
Figure 11:
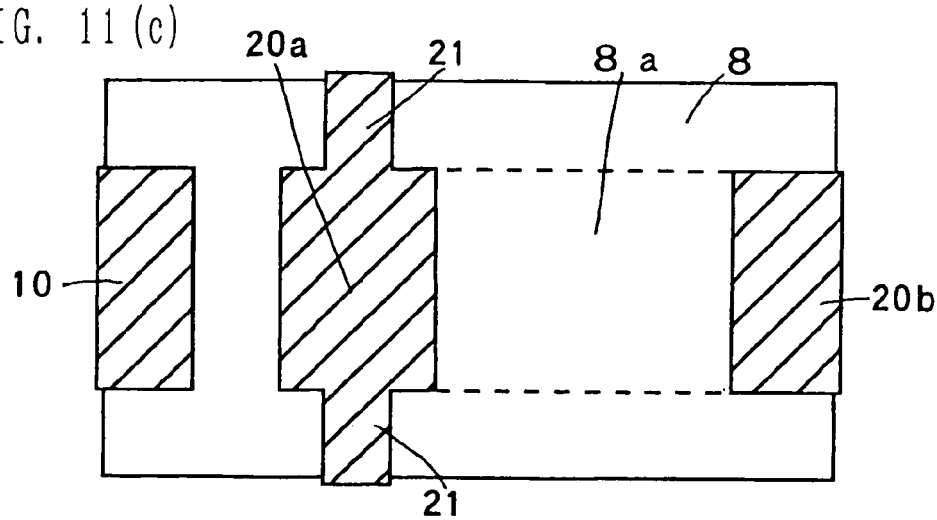

FIG. 11 shows other embodiments in which (a) an extending portion 21 is provided with the same width of that of a first cathode exposed portion 20a, (b) an extending portion 21 is provided on a side of a first cathode exposed portion 20a facing to a second cathode exposed portion 20b, (c) an extending portion is provided in a middle portion of a first cathode exposed portion to obtain the same effect.

In the present embodiment, a sintered tantalum was used as a material of an anode element, but the material is not particularly limited if a valve-action metal is used. Use of sintered body or foil of niobium, titanium, aluminum, etc. can also lead to the same effect.

INDUSTRIAL APPLICABILITY

According to the present invention, a difference in area between the anode exposed portion and each of the cathode exposed portions can be made smaller, and an area ratio of the land corresponding to each of the exposed portions (a difference between solder paste quantities) can be also made smaller. Therefore, displacement of the solid electrolytic capacitor can be suppressed, and a problem of a defective appearance etc. can be solved with excellent solder paste.

The invention claimed is:

1. A solid electrolytic capacitor comprising a capacitor element in which a dielectric coating layer and a cathode layer are sequentially formed on a surface of an anode element, an anode terminal and a cathode terminal connected to the anode element and cathode layer, respectively, and arranged apart from each other along a first direction, and an enclosure resin coating the capacitor element,
wherein the anode terminal and cathode terminal have an anode exposed portion and a cathode exposed portion, respectively, exposed from the enclosure resin on a bottom face of the solid electrolytic capacitor,
wherein the cathode terminal formed in the form of a flat plate mounts the capacitor element on an upper face thereof, and a lower face of the platy cathode terminal and the anode terminal are exposed on a same plane from the enclosure resin,
wherein the cathode exposed portion has an extending portion extending on the bottom face to an end in a second direction of the solid electrolytic capacitor, the second direction being a direction perpendicular to the first direction,
wherein the extending portion is arranged on the bottom face in a position apart from an end in the first direction of the solid electrolytic capacitor.

2. The solid electrolytic capacitor according to claim 1, wherein the cathode terminal has a cathode second direction end exposed portion exposed from the enclosure resin on an end face in the second direction of the solid electrolytic capacitor, wherein the cathode second direction end exposed portion continues into the extending portion.

3. The solid electrolytic capacitor according to claim 1, wherein the cathode exposed portion has a first cathode exposed portion and second cathode exposed portion arranged on the bottom face in positions apart from each other,
wherein the cathode terminal comprises a single piece having the first cathode exposed portion and second cathode exposed portion.

4. The solid electrolytic capacitor according to claim 3, wherein the enclosure resin is exposed on the bottom face in a position between the first cathode exposed portion and second cathode exposed portion.

5. A solid electrolytic capacitor mounting body having fixed to a circuit board through a solder layer a solid electrolytic capacitor according to claim 1, wherein the circuit board is provided with at least one land opposed to the anode exposed portion and at least two lands opposed to the cathode exposed portion.

6. A solid electrolytic capacitor comprising a capacitor element in which a dielectric coating layer and a cathode layer are sequentially formed on a surface of an anode element, an anode terminal and a cathode terminal connected to the anode element and cathode layer, respectively, and arranged apart from each other along a first direction, and an enclosure resin coating the capacitor element,
wherein the anode terminal and cathode terminal have an anode exposed portion and a cathode exposed portion, respectively, exposed from the enclosure resin on a bottom face of the solid electrolytic capacitor,
wherein the cathode exposed portion has an extending portion extending on the bottom face to an end in a second direction of the solid electrolytic capacitor, the second direction being a direction perpendicular to the first direction,
wherein the extending portion is arranged on the bottom face in a position apart from an end in the first direction of the solid electrolytic capacitor,
wherein the extending portion extends on the bottom face to one and the other ends in the second direction of the solid electrolytic capacitor.

7. A solid electrolytic capacitor comprising a capacitor element in which a dielectric coating layer and a cathode layer are sequentially formed on a surface of an anode element, an anode terminal and a cathode terminal connected to the anode element and cathode layer, respectively, and arranged apart from each other along a first direction, and an enclosure resin coating the capacitor element,
wherein the anode terminal and cathode terminal have an anode exposed portion and a cathode exposed portion, respectively, exposed from the enclosure resin on a bottom face of the solid electrolytic capacitor,
wherein the cathode exposed portion has an extending portion extending on the bottom face to an end in a second direction of the solid electrolytic capacitor, the second direction being a direction perpendicular to the first direction,
wherein the extending portion is arranged on the bottom face in a position apart from an end in the first direction of the solid electrolytic capacitor,
wherein the cathode terminal has a cathode first direction end exposed portion exposed from the enclosure resin on one end face in the first direction of the solid electrolytic capacitor, and
the anode terminal has an anode first direction end exposed portion exposed from the enclosure resin on the other end face in the first direction of the solid electrolytic capacitor.

8. A solid electrolytic capacitor comprising a capacitor element in which a dielectric coating layer and a cathode layer are sequentially formed on a surface of an anode element, an anode terminal and a cathode terminal connected to the anode element and cathode layer, respectively, and arranged apart from each other along a first direction, and an enclosure resin coating the capacitor element,
wherein the anode terminal and cathode terminal have an anode exposed portion and a cathode exposed portion, respectively, exposed from the enclosure resin on a bottom face of the solid electrolytic capacitor,
wherein the cathode exposed portion has an extending portion extending on the bottom face to an end in a second direction of the solid electrolytic capacitor, the second direction being a direction perpendicular to the first direction, wherein the extending portion is arranged on the bottom face in a position apart from an end in the first direction of the solid electrolytic capacitor, wherein the cathode exposed portion has a first cathode exposed portion and second cathode exposed portion arranged on the bottom face in positions apart from each other, wherein the cathode terminal comprises a single piece having the first cathode exposed portion and second cathode exposed portion, wherein the first cathode exposed portion is arranged in a position between the anode exposed portion and the second cathode exposed portion, and has the extending portion.

9. A solid electrolytic capacitor comprising a capacitor element in which a dielectric coating layer and a cathode layer are sequentially formed on a surface of an anode element, an anode terminal and a cathode terminal connected to the anode element and cathode layer, respectively, and arranged apart from each other along a first direction, and an enclosure resin coating the capacitor element, wherein the anode terminal and cathode terminal have an anode exposed portion and a cathode exposed portion, respectively, exposed from the enclosure resin on a bottom face of the solid electrolytic capacitor, wherein the cathode exposed portion has an extending portion extending on the bottom face to an end in a second direction of the solid electrolytic capacitor, the second direction being a direction perpendicular to the first direction, wherein a width in the first direction of the extending portion is narrower than a width in the first direction of a portion continuing into the extending portion of the cathode exposed portion.

10. The solid electrolytic capacitor according to claim 9, wherein the extending portion extends on the bottom face to one and the other ends in the second direction of the solid electrolytic capacitor.

11. The solid electrolytic capacitor according to claim 9, wherein the cathode terminal has a cathode second direction end exposed portion exposed from the enclosure resin on an end face in the second direction of the solid electrolytic capacitor, wherein the cathode second direction end exposed portion continues into the extending portion.

12. The solid electrolytic capacitor according to claim 9, wherein the cathode terminal has a cathode first direction end exposed portion exposed from the enclosure resin on one end face in the first direction of the solid electrolytic capacitor, and the anode terminal has an anode first direction end exposed portion exposed from the enclosure resin on the other end face in the first direction of the solid electrolytic capacitor.

13. The solid electrolytic capacitor according to claim 9, wherein the cathode exposed portion has a first cathode exposed portion and second cathode exposed portion arranged on the bottom face in positions apart from each other, wherein the cathode terminal comprises a single piece having the first cathode exposed portion and second cathode exposed portion.

14. The solid electrolytic capacitor according to claim 13, wherein the first cathode exposed portion is arranged in a position between the anode exposed portion and the second cathode exposed portion, and has the extending portion.

15. The solid electrolytic capacitor according to claim 13, wherein the enclosure resin is exposed on the bottom face in a position between the first cathode exposed portion and second cathode exposed portion.

16. A solid electrolytic capacitor mounting body having fixed to a circuit board through a solder layer a solid electrolytic capacitor according to claim 13, wherein the circuit board is provided with at least one land opposed to the anode exposed portion, at least one land opposed to the first cathode exposed portion, and at least one land opposed to the second cathode exposed portion.

17. A solid electrolytic capacitor mounting body having fixed to a circuit board through a solder layer a solid electrolytic capacitor according to claim 9, wherein the circuit board is provided with at least one land opposed to the anode exposed portion and at least two lands opposed to the cathode exposed portion.

18. A solid electrolytic capacitor comprising a capacitor element in which a dielectric coating layer and a cathode layer are sequentially formed on a surface of an anode element, an anode terminal and a cathode terminal connected to the anode element and cathode layer, respectively, and arranged apart from each other along a first direction, and an enclosure resin coating the capacitor element, wherein the anode terminal and cathode terminal have an anode exposed portion and a cathode exposed portion, respectively, exposed from the enclosure resin on a bottom face of the solid electrolytic capacitor, wherein the cathode terminal formed in the form of a flat plate mounts the capacitor element on an upper face thereof, and a lower face of the platy cathode terminal and the anode terminal are exposed on a same plane from the enclosure resin, wherein the cathode terminal has a cathode second direction end exposed portion exposed from the enclosure resin on an end face in a second direction of the solid electrolytic capacitor, the second direction being a direction perpendicular to the first direction, wherein the cathode second direction end exposed portion continues into the cathode exposed portion, and is arranged on the end face in the second direction of the solid electrolytic capacitor in a position apart from an end in the first direction of the solid electrolytic capacitor.

19. The solid electrolytic capacitor according to claim 18, wherein the cathode second direction end exposed portion is exposed from the enclosure resin on one and the other ends in the second direction of the solid electrolytic capacitor.

20. The solid electrolytic capacitor according to claim 18, wherein the cathode exposed portion has a first cathode exposed portion and second cathode exposed portion arranged on the bottom face in positions apart from each other, wherein the cathode terminal comprises a single piece having the first cathode exposed portion and second cathode exposed portion.

21. The solid electrolytic capacitor according to claim 20, wherein the enclosure resin is exposed on the bottom face in a position between the first cathode exposed portion and second cathode exposed portion.

22. A solid electrolytic capacitor comprising a capacitor element in which a dielectric coating layer and a cathode layer are sequentially formed on a surface of an anode element, an anode terminal and a cathode terminal connected to the anode element and cathode layer, respectively, and arranged apart from each other along a first direction, and an enclosure resin coating the capacitor element, wherein the anode terminal and cathode terminal have an anode exposed portion and a cathode exposed portion, respectively, exposed from the enclosure resin on a bottom face of the solid electrolytic capacitor, wherein the cathode terminal has a cathode second direction end exposed portion exposed from the enclosure resin on an end face in a second direction of the solid electrolytic capacitor, the second direction being a direction perpendicular to the first direction, wherein the cathode second direction end exposed portion continues into the cathode exposed portion, and is arranged on the end face in the second direction of the solid electrolytic capacitor in a position apart from an end in the first direction of the solid electrolytic capacitor, wherein the cathode exposed portion has a first cathode exposed portion and second cathode exposed portion arranged on the bottom face in positions apart from each other, wherein the cathode terminal comprises a single piece having the first cathode exposed portion and second cathode exposed portion, wherein the first cathode exposed portion is arranged in a position between the anode exposed portion and the second cathode exposed portion, and continues into the cathode second direction end exposed portion.

23. A solid electrolytic capacitor comprising a capacitor element in which a dielectric coating layer and a cathode layer are sequentially formed on a surface of an anode element, an anode terminal and a cathode terminal connected to the anode element and cathode layer, respectively, and arranged apart from each other along a first direction, and an enclosure resin coating the capacitor element, wherein the anode terminal and cathode terminal have an anode exposed portion and a cathode exposed portion, respectively, exposed from the enclosure resin on a bottom face of the solid electrolytic capacitor, wherein the cathode terminal formed in the form of a flat plate mounts the capacitor element on an upper face thereof, and a lower face of the platy cathode terminal and the anode terminal are exposed on a same plane from the enclosure resin, wherein the cathode exposed portion has a first cathode exposed portion and second cathode exposed portion arranged on the bottom face in positions apart from each other, wherein the cathode terminal comprises a single piece having the first cathode exposed portion and second cathode exposed portion.

24. The solid electrolytic capacitor according to claim 23, wherein the enclosure resin is exposed on the bottom face in a position between the first cathode exposed portion and second cathode exposed portion.

25. A solid electrolytic capacitor comprising a capacitor element in which a dielectric coating layer and a cathode layer are sequentially formed on a surface of an anode element, an anode terminal and a cathode terminal connected to the anode element and cathode layer, respectively, and arranged apart from each other along a first direction, and an enclosure resin coating the capacitor element, wherein the anode terminal and cathode terminal have an anode exposed portion and a cathode exposed portion, respectively, exposed from the enclosure resin on a bottom face of the solid electrolytic capacitor, wherein the cathode exposed portion has a first cathode exposed portion and second cathode exposed portion arranged on the bottom face in positions apart from each other, wherein the cathode terminal comprises a single piece having the first cathode exposed portion and second cathode exposed portion, wherein the anode exposed portion is arranged on the bottom face to contact to one end in the first direction of the solid electrolytic capacitor, and the second cathode exposed portion is arranged on the bottom face to contact to the other end in the first direction of the solid electrolytic capacitor, wherein the shortest distance between the first cathode exposed portion and the anode exposed portion is shorter than that between the first cathode exposed portion and the second cathode exposed portion.

26. A solid electrolytic capacitor mounting body having fixed to a circuit board through a solder layer a solid electrolytic capacitor according to claim 25, wherein the circuit board is provided with at least one land opposed to the anode exposed portion, at least one land opposed to the first cathode exposed portion, and at least one land opposed to the second cathode exposed portion.

27. A solid electrolytic capacitor comprising a capacitor element in which a dielectric coating layer and a cathode layer are sequentially formed on a surface of an anode element, an anode terminal and a cathode terminal connected to the anode element and cathode layer, respectively, and arranged apart from each other along a first direction, and an enclosure resin coating the capacitor element, wherein the anode terminal and cathode terminal have an anode exposed portion and a cathode exposed portion, respectively, exposed from the enclosure resin on a bottom face of the solid electrolytic capacitor, wherein the cathode terminal formed in the form of a flat plate mounts the capacitor element on an upper face thereof, and a lower face of the platy cathode terminal and the anode terminal are exposed on a same plane from the enclosure resin, wherein the cathode exposed portion is arranged on the bottom face in a position apart from an end in the first direction of the solid electrolytic capacitor.

28. A solid electrolytic capacitor mounting body having fixed to a circuit board through a solder layer a solid electrolytic capacitor comprising a capacitor element in which a dielectric coating layer and a cathode layer are sequentially formed on a surface of an anode element, an anode terminal and a cathode terminal connected to the anode element and cathode layer, respectively, and arranged apart from each other along a first direction, and an enclosure resin coating the capacitor element, wherein the anode terminal and cathode terminal have an anode exposed portion and a cathode exposed portion, respectively, exposed from the enclosure resin on a bottom face of the solid electrolytic capacitor, wherein the circuit board is provided with at least one anode land opposed to the anode exposed portion and a plurality of cathode lands opposed to the cathode exposed portion, wherein at least two of the plurality of cathode lands are arranged along the first direction.

29. The solid electrolytic capacitor mounting body according to claim 28, wherein the cathode exposed portion has a first cathode exposed portion and second cathode exposed portion arranged on the bottom face in positions apart from each other, wherein the circuit board is provided with at least one land opposed to the anode exposed portion, at least one land opposed to the first cathode exposed portion, and at least one land opposed to the second cathode exposed portion.

30. A solid electrolytic capacitor mounting body having fixed to a circuit board through a solder layer a solid electrolytic capacitor comprising a capacitor element in which a dielectric coating layer and a cathode layer are sequentially formed on a surface of an anode element, an anode terminal and a cathode terminal connected to the anode element and cathode layer, respectively, and arranged apart from each other along a first direction, and an enclosure resin coating the capacitor element,
wherein the anode terminal and cathode terminal have an anode exposed portion and a cathode exposed portion, respectively, exposed from the enclosure resin on a bottom face of the solid electrolytic capacitor,
wherein the cathode terminal has a cathode second direction end exposed portion exposed from the enclosure resin on an end face in a second direction of the solid electrolytic capacitor, the second direction being a direction perpendicular to the first direction,
wherein the cathode second direction end exposed portion continues into the cathode exposed portion, and is arranged on the end face in the second direction of the solid electrolytic capacitor in a position apart from an end in the first direction of the solid electrolytic capacitor,
wherein the circuit board is provided with at least one land opposed to the anode exposed portion and at least two lands opposed to the cathode exposed portion.

31. A solid electrolytic capacitor mounting body having fixed to a circuit board through a solder layer a solid electrolytic capacitor comprising a capacitor element in which a dielectric coating layer and a cathode layer are sequentially formed on a surface of an anode element, an anode terminal and a cathode terminal connected to the anode element and cathode layer, respectively, and arranged apart from each other along a first direction, and an enclosure resin coating the capacitor element,
wherein the anode terminal and cathode terminal have an anode exposed portion and a cathode exposed portion, respectively, exposed from the enclosure resin on a bottom face of the solid electrolytic capacitor,
wherein the cathode exposed portion has an extending portion extending on the bottom face to an end in a second direction of the solid electrolytic capacitor, the second direction being a direction perpendicular to the first direction,
wherein the extending portion is arranged on the bottom face in a position apart from an end in the first direction of the solid electrolytic capacitor,
wherein the cathode exposed portion has a first cathode exposed portion and second cathode exposed portion arranged on the bottom face in positions apart from each other,
wherein the cathode terminal comprises a single piece having the first cathode exposed portion and second cathode exposed portion,
wherein the circuit board is provided with at least one land opposed to the anode exposed portion, at least one land opposed to the first cathode exposed portion, and at least one land opposed to the second cathode exposed portion.

32. A solid electrolytic capacitor comprising a capacitor element in which a dielectric coating layer and a cathode layer are sequentially formed on a surface of an anode element, an anode terminal and, a cathode terminal connected to the anode element and cathode layer, respectively, and arranged apart from each other along a first direction, and an enclosure resin coating the capacitor element,
wherein a lower face of the capacitor element is opposed and connected to an upper face of the cathode terminal across approximately whole area forming the cathode layer with respect to the first direction,
wherein the anode terminal and cathode terminal have an anode exposed portion and a cathode exposed portion, respectively, exposed from the enclosure resin on a bottom face of the solid electrolytic capacitor,
wherein the cathode exposed portion is located at least immediately below the capacitor element.

33. The solid electrolytic capacitor according to claim 32, wherein the cathode terminal has a cathode first direction end exposed portion exposed from the enclosure resin on one end face in the first direction of the solid electrolytic capacitor, and the anode terminal has an anode first direction end exposed portion exposed from the enclosure resin on the other end face in the first direction of the solid electrolytic capacitor.

34. A solid electrolytic capacitor comprising a capacitor element in which a dielectric coating layer and a cathode layer are sequentially formed on a surface of an anode element, an anode terminal and, a cathode terminal connected to the anode element and cathode layer, respectively, and arranged apart from each other along a first direction, and an enclosure resin coating the capacitor element,
wherein a lower face of the capacitor element is opposed and connected to an upper face of the cathode terminal across approximately whole area forming the cathode layer with respect to the first direction,
wherein the anode terminal and cathode terminal have an anode exposed portion and a cathode exposed portion, respectively, exposed from the enclosure resin on a bottom face of the solid electrolytic capacitor,
wherein the cathode exposed portion is located at least immediately below the capacitor element,
wherein the cathode exposed portion has a first cathode exposed portion and second cathode exposed portion arranged on the bottom face in positions apart from each other.

35. The solid electrolytic capacitor according to claim 34, wherein the enclosure resin is exposed on the bottom face in a position between the first cathode exposed portion and second cathode exposed portion.

36. The solid electrolytic capacitor according to claim 35, wherein the cathode terminal has a cathode first direction end exposed portion exposed from the enclosure resin on one end face in the first direction of the solid electrolytic capacitor, and
the anode terminal has an anode first direction end exposed portion exposed from the enclosure resin on the other end face in the first direction of the solid electrolytic capacitor.

37. The solid electrolytic capacitor according to claim 34, wherein the cathode second direction end exposed portion is exposed from the enclosure resin on one and the other ends in the second direction of the solid electrolytic capacitor.

38. A solid electrolytic capacitor comprising a capacitor element in which a dielectric coating layer and a cathode layer are sequentially formed on a surface of an anode element, an anode terminal and, a cathode terminal connected to the anode element and cathode layer, respectively, and arranged apart from each other along a first direction, and an enclosure resin coating the capacitor element,
- wherein a lower face of the capacitor element is opposed and connected to an upper face of the cathode terminal across approximately whole area forming the cathode layer with respect to the first direction,
- wherein the anode terminal and cathode terminal have an anode exposed portion and a cathode exposed portion, respectively, exposed from the enclosure resin on a bottom face of the solid electrolytic capacitor,
- wherein the cathode exposed portion is located at least immediately below the capacitor element,
- wherein the cathode terminal has a cathode second direction end exposed portion exposed from the enclosure resin on an end face in a second direction of the solid electrolytic capacitor, the second direction being a direction perpendicular to the first direction,
- wherein the cathode second direction end exposed portion continues into the cathode exposed portion, and is arranged on the end face in the second direction of the solid electrolytic capacitor in a position apart from an end in the first direction of the solid electrolytic capacitor.

39. A solid electrolytic capacitor comprising a capacitor element in which a dielectric coating layer and a cathode layer are sequentially formed on a surface of an anode element, an anode terminal and a cathode terminal connected to the anode element and cathode layer, respectively, and arranged apart from each other along a first direction, and an enclosure resin coating the capacitor element,
- wherein the anode terminal and cathode terminal have an anode exposed portion and a cathode exposed portion, respectively, exposed from the enclosure resin on a bottom face of the solid electrolytic capacitor,
- wherein the cathode terminal has a cathode second direction end exposed portion exposed from the enclosure resin on an end face in a second direction of the solid electrolytic capacitor, the second direction being a direction perpendicular to the first direction,
- wherein the cathode second direction end exposed portion continues into the cathode exposed portion, and is arranged on the end face in the second direction of the solid electrolytic capacitor in a position apart from an end in the first direction of the solid electrolytic capacitor,
- wherein the cathode second direction end exposed portion is exposed from the enclosure resin on one and the other ends in the second direction of the solid electrolytic capacitor,
- wherein the cathode terminal has a cathode first direction end exposed portion exposed from the enclosure resin on one end face in the first direction of the solid electrolytic capacitor, and
- the anode terminal has an anode first direction end exposed portion exposed from the enclosure resin on the other end face in the first direction of the solid electrolytic capacitor.

* * * * *